United States Patent
Nagata

(10) Patent No.: US 7,576,566 B2
(45) Date of Patent: Aug. 18, 2009

(54) LEVEL-CONVERSION CIRCUIT

(75) Inventor: Kyoichi Nagata, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 20 days.

(21) Appl. No.: 11/850,748

(22) Filed: Sep. 6, 2007

(65) Prior Publication Data

US 2007/0296482 A1    Dec. 27, 2007

Related U.S. Application Data

(62) Division of application No. 11/087,688, filed on Mar. 24, 2005, now Pat. No. 7,288,963.

(30) Foreign Application Priority Data

Mar. 24, 2004    (JP)    ............... 2004-086757

(51) Int. Cl.
*H03K 19/0175*    (2006.01)
(52) U.S. Cl. .......................... 326/81; 326/86
(58) Field of Classification Search .............. 326/68, 326/80–83, 86; 327/108, 109
See application file for complete search history.

(56) References Cited

U.S. PATENT DOCUMENTS

| 5,723,986 A | 3/1998 | Nakashiro et al. |
| 5,966,030 A | 10/1999 | Schmitt et al. |
| 6,011,421 A * | 1/2000 | Jung .......................... 327/333 |
| 6,018,252 A | 1/2000 | Imaizumi |
| 6,127,848 A * | 10/2000 | Wert et al. ................. 326/81 |
| 6,177,819 B1 * | 1/2001 | Nguyen ..................... 327/112 |

FOREIGN PATENT DOCUMENTS

| JP | 5-122053 | 5/1993 |
| JP | 5-235737 | 9/1993 |
| JP | 6-309873 | 11/1994 |
| JP | 7-79148 | 3/1995 |
| JP | 7-226670 | 8/1995 |
| JP | 7-307661 | 11/1995 |
| JP | 8-162941 | 6/1996 |
| JP | 10-209853 | 8/1998 |
| JP | 2000-295094 | 10/2000 |
| JP | 2001-85982 | 3/2001 |
| JP | 2002-135107 | 5/2002 |

* cited by examiner

*Primary Examiner*—James Cho
(74) *Attorney, Agent, or Firm*—Young & Thompson

(57) ABSTRACT

An independent control signal is transmitted to each of a driver control unit and an output transistor, so as to prevent the driver control unit and the output transistor from being made to operate at the same time and reduce through-current flows. Since the transistor ratio can be selected easily, the degree of designing flexibility increases and the speed enhancement is achieved.

12 Claims, 12 Drawing Sheets

LEVEL-CONVERSION CIRCUIT

This application claims priority to prior Japanese patent application JP 2004-86757, the disclosure of which is incorporated herein by reference.

BACKGROUND OF THE INVENTION

1. Field of the Invention

The present invention relates to a level-conversion circuit and particularly relates to a level-conversion circuit for converting a small-amplitude-signal level and a semiconductor circuit including the level-conversion circuit and/or the small-amplitude-signal-level conversion circuit.

2. Description of the Related Art

In recent years, as the scale of integration and speed of large-scale integrated (LSI) circuits have become increasingly high, the amount of currents consumed by the LSI circuits has raised concerns. For example, where the integration scale of a DRAM increases to two times, the current consumption thereof does not increase to two times. Further, since clock frequencies increase, the increased frequency amount causes the current consumption to increase. Hitherto, measures for decreasing the power-source voltage have been taken, for example, for decreasing the current consumption. To achieve this, the capacities of transistors must be significantly improved, even though in many cases the capacities have already been improved to a level of saturation.

Various types of methods have been proposed, as low-power consumption technologies that require no process-technology development. For example, a reduction of the signal amplitude in long-distance wiring between blocks provided on a chip is significantly effective for reducing operation currents. In the case where a DRAM of about 256 Mbits is used, for example, about 45 percent of an entire burst current IDD4 corresponds to charge/discharge currents flowing in wiring on the chip. Therefore, where the charge/discharge currents in the wiring is decreased to one-second, that is to say, where the signal amplitude in the wiring is decreased to one-second, 22.5 percent of the burst current IDD4 is reduced.

However, several problems arise for decreasing the signal amplitude of the wiring to a small level. First, a level-conversion circuit is required of a circuit for receiving a small-amplitude signal. Hitherto, the level-conversion circuit operates at a low speed and uses the small-amplitude signal at many places, which sacrifices the characteristic of the circuit for receiving the small-amplitude signal. Therefore, the level-conversion circuits have been hardly used.

FIGS. 1A, 1B, and 1C show driver circuits for transmitting a small-amplitude signal and FIGS. 2A, 2B, and 2C show the waveforms thereof. In general, the output amplitude of a CMOS circuit is determined by the source voltage of a PMOS transistor on the load side and the source voltage of an NMOS transistor on the driver side. In the small-amplitude driver circuits of FIGS. 1A, 1B, and 1C, the source voltage of the PMOS transistor is made to be different from that of the NMOS transistor, so as to obtain a small-amplitude signal.

The small-amplitude driver circuit of FIG. 1A includes a power-source voltage VDD, an inverter circuit connected to a ground voltage VSS, a power-source voltage VDDL, and a driving inverter circuit connected to a ground voltage VSSH. The driving inverter circuit transmits the power-source voltage VDDL lower than the power-source voltage VDD to the source voltage of the PMOS transistor on the load side and transmits the ground voltage VSSH higher than the ground voltage VSS to the source voltage of the NMOS transistor on the driver side. Therefore, an input-signal amplitude VDD to VSS is transmitted, as a small amplitude VDDL to VSSH, as shown in FIG. 2A. At that time, a voltage Vgs between the gate and source of the PMOS transistor corresponds to an amplitude VDDL to VSS. Further, a voltage Vgs between the gate and source of the NMOS transistor corresponds to an amplitude VDD to VSSH. Since both voltages are small, an ON current Ids of each of the transistors is small and the capacity for charging and discharging wiring is small. Consequently, the signal-transmission speed of each of the transistors is low. Therefore, the threshold value (Vt) of each of the PMOS and NMOS transistors in an output stage is decreased, so as to be lower than the threshold value of an ordinary transistor. Thus, the ON current of each of the PMOS and NMOS transistors increases, so that the capacity for charging and discharging the wiring and the signal-transmission speed increase.

On the other hand, in each of small-amplitude driver circuits shown in FIGS. 1B and 1C, the voltage of either a transistor on the high-level side or a transistor on the low-level side is low. FIGS. 2B and 2C show the waveforms generated by the small-amplitude driver circuits shown in FIGS. 1B and 1C. In the small-amplitude driver circuit shown in FIG. 1B, the power-source voltage VDDL lower than the power-source voltage VDD is transmitted to the source voltage of the PMOS transistor on the load side and the amplitude level thereof is indicated, as VDDL to VSS. However, where a small-amplitude signal falls, the gate voltage of the NMOS transistor is the power-source voltage VDD and the source voltage thereof is the power-source voltage VSS. Consequently, the voltage Vgs corresponds to the amplitude VDD to VSS. However, where the small-amplitude signal rises, the gate voltage corresponds to the power-source voltage VSS, and the source voltage corresponds to the power-source voltage VDDL. Therefore, the voltage Vgs corresponds to the amplitude VDDL to VSS, the current Ids decreases, and the rising speed of an output signal becomes low. Accordingly, development has been made of a configuration for increasing the signal-transmission speed by decreasing the threshold value of only the PMOS transistor of the driver circuit.

FIGS. 1C and 2C show an example where the ground voltage VSSH higher than the ground voltage VSS is transmitted to the source voltage of the NMOS transistor, where the amplitude level is indicated, as VDDL to VSS. In this example, where a small-amplitude signal rises, the gate voltage of the PMOS transistor corresponds to the ground voltage VSS and the source voltage thereof corresponds to the power-source voltage VDD. Therefore, the voltage Vgs corresponds to the amplitude VDD to VSS. However, where the small-amplitude signal falls, the gate voltage corresponds to the power-source voltage VDD and the source voltage corresponds to the power-source voltage VDDL, so that the voltage Vgs corresponds to the amplitude VDD to VSSH. Consequently, the current Ids decreases and the falling speed of an output signal becomes low. Accordingly, development has been made of a configuration for increasing the signal-transmission speed by decreasing the threshold value of only the NMOS transistor of the driver circuit.

FIG. 3 shows a first known level-conversion circuit. The first known level-conversion circuit receives a small-amplitude signal (VDDL to VSS), as an input signal, and transmits a full-amplitude signal due to a ratio operation of an input stage. Therefore, the capacity of a PMOS transistor of an input-stage circuit is small and that of an NMOS transistor is large, so that the PMOS transistor and the NMOS transistor are made to perform the ratio operation. Accordingly, the falling speed of nodes N12 and N13 is high while the rising speed thereof is low. Therefore, even though the first known level-conversion circuit can generate an output signal with high speed at the time where an input signal IN rises, the first known level-conversion circuit generates an output signal with low speed at the time where the input signal IN falls. Specifically, a difference occurs between the signal rising speed and the signal falling speed. Accordingly, the first known level-conversion circuit cannot be used for the case where a signal needs to be caused to transition with high speed at both the falling time and the rising time.

FIG. 4 shows the configuration of a second known level-conversion circuit according to Japanese Unexamined Patent Application Publication No. 2002-135107 disclosing a technology for solving the problems of the above-described first known level-conversion circuit. The second known level-conversion circuit uses a method for preventing an output signal from being affected by the time delay generated due to the ratio operation of a level-conversion unit. In the second known level-conversion circuit configured in the same way as in the case of the first known level-conversion circuit, the rising speed of nodes N12 and N13 is high and the falling speed thereof is low due to the ratio operation of the PMOS transistor and the NMOS transistor. The second known level-conversion circuit uses a circuit technology for informing an output signal of only the input-signal rising that causes the second known level-conversion circuit to operate with high speed. However, since one of complementary input stages is slow, a through-current flow between the power-source voltage VDD and the ground voltage VSS is large.

Further, FIG. 5 shows the configuration of a third known level-conversion circuit that is disclosed in Japanese Unexamined Patent Application Publication No. 7-307661 and that is provided for a small-amplitude signal level (VDDL to VSSH). The third known level-conversion circuit operates by the power-source voltage VDDL that is lower than the power-source voltage VDD and the ground voltage VSSH higher than the ground voltage VSS, namely, the signal amplitude VDDL to VSSH. A receiver first stage of the third known level-conversion circuit comprises an inverter buffer circuit and a source-follower transistor for dropping the power-source voltage VDD. When the input signal IN rises and changes, a node N16 falls and a through-current flow is generated. At that time, the source-follower transistor drops the power-source voltage, so as to reduce the through-current flow. When the input signal falls and changes, the node N16 rises, so that the output signal OUT falls. Since the output signal OUT falls, a feedback PMOS transistor is turned on, so that the voltage of the node 16 drops to the power-source voltage VDD. Since the operation speed of the third known level-conversion circuit is easily affected by the ratio operation of the PMOS transistor and the NMOS transistor and the configuration in which a full-amplitude circuit receives a small-amplitude signal, the small-amplitude voltage level, the transistor threshold value, and the ratio of the receiver first stage need to be selected with caution so as to prevent the through-current flow being generated.

SUMMARY OF THE INVENTION

The above-described known level-conversion circuits have the following problems. Namely, even though each of the known level-conversion circuits is configured for reducing a through-current flow by increasing the ratio of transistors in the receiver first stage and adding a voltage-drop circuit on the power-source-voltage side, the through-current flow between the power-source voltage and the ground voltage is still large, since a small-amplitude input signal is received by an input stage with a high power-source voltage. Further, for reducing the through-current flow and converting the small-amplitude signal into a power-source-voltage full-swing amplitude signal, the small-amplitude voltage level, the transistor threshold value, the input-stage ratio, and so forth, have to be set under limiting conditions. Therefore, it is difficult to form a level-conversion circuit that satisfies the above-described requirements and operates with high speed.

Accordingly, it is an object of the present invention to provide a level-conversion circuit that solves the above-described problems, has a small through-current flow, consumes a small amount of power, and operates with high speed, and a semiconductor circuit including the level-conversion circuit.

A level-conversion circuit according to an aspect of the present invention comprises an input-timing control unit, a PMOS-driver control unit, an NMOS-driver control unit, and an output unit. The input-timing control unit receives a small-amplitude signal, as an input signal, and transmits an inverted-input signal generated by inverting the input signal. The output unit transmits a large-amplitude output signal according to at least two control signals transmitted from the PMOS-driver control unit and the NMOS-driver control unit to which the input signal and the inverted-and-input signal are transmitted.

Preferably, in the level-conversion circuit, the output unit includes first and second transistors so that where the first transistor is turned on and transmits a first large-amplitude level signal, the second transistor is turned off. Further, where the second transistor is turned on and transmits a second large-amplitude level signal, the first transistor may be turned off.

Preferably, in the level-conversion circuit, the output unit further includes a data-holding unit. Each of the control signals transmitted from the PMOS-driver control unit and the NMOS-driver control unit may be a one-shot-pulse control signal. The output unit may transmit the large-amplitude output signal due to the one-shot-pulse signal, and the data-holding unit may hold the large-amplitude output signal.

Preferably, in the level-conversion circuit, a pulse width of the one-shot-pulse signal may correspond to delay time for generating the inverted-and-input signal.

Preferably, in the level-conversion circuit of the present invention, the large-amplitude output signal may be held by separating the inverted-and-input signal by a non-activation signal and connecting the large-amplitude output signal to the PMOS-driver control unit and the NMOS-driver control unit.

A level-conversion circuit according to another aspect of the present invention comprises an input-timing control unit for receiving third and fourth power-source-level small-amplitude input signals, a PMOS-driver control unit, an NMOS-driver control unit, and an output unit for transmitting first and second power-source-level large-amplitude output signals. The output unit includes a first transistor for transmitting the first power-source-level large-amplitude output signal and a second transistor for transmitting the second power-source-level large-amplitude output signal. Where the first transistor is turned on, the second transistor is turned off, and where the second transistor is turned on, the first transistor is turned off.

Preferably, in the level-conversion circuit, where the small-amplitude input signal is caused to transition from the fourth power-source level to the third power-source level, an output signal transmitted from the PMOS-driver control unit may be caused to transition from the first power-source level to the fourth power-source level and caused to transition to the first power-source level after a predetermined time period. Further, where the small-amplitude input signal is caused to transition from the third power-source level to the fourth power-source level, an output signal transmitted from the NMOS-driver control unit is caused to transition from the second power-source level to the third power-source level and caused to transition to the second power-source level after another predetermined time period.

Preferably, in the level-conversion circuit, the PMOS-driver control unit may comprise a third transistor for transmitting the fourth power-source-level output signal to the output unit and a fifth transistor. The fifth transistor may stop power transmitted from a first power source for a predetermined time period at the instant when the third transistor is turned on and receive the power transmitted from the first power source over a period of time during the third transistor is turned off. The NMOS-driver control unit may comprise a fourth transistor for transmitting the third power-source-level output signal to the output unit, and a sixth transistor. The sixth transistor may stop power transmitted from a second power source for a predetermined time period at the instant when the fourth transistor is turned on and receive the power transmitted from the second power source over a period of time during the fourth transistor is turned off.

Preferably, in the level-conversion circuit, an input signal transmitted to each of gates of the fifth and sixth transistors may be switched to an output signal by using a non-activation signal, so as to hold the output signal.

A level-conversion circuit according to another aspect of the present invention comprises a PMOS-driver control unit, an NMOS-driver control unit, a PMOS-side power-source control unit, an NMOS-side power-source control unit, an output unit, and an output-feedback unit. Each of the PMOS-driver control unit and the NMOS-driver control unit inverts a small-amplitude input signal and transmits the inverted small-amplitude input signal to the output unit. Each of the PMOS-side power-source control unit and the NMOS-side power-source control unit establishes and/or does not establish electrical continuity between the output unit and at least one power source, upon receiving the inverted and output signal and/or a delayed output signal, so that the output unit transmits a large-amplitude output signal.

Preferably, in the level-conversion circuit, each of the PMOS-side power-source control unit and the NMOS-side power-source control unit may transmit a large current to the output unit over a period of time during the output signal is delayed.

A level-conversion circuit according to another aspect of the present invention comprises an output unit including a first transistor for transmitting a first power-source-level large-amplitude output signal and a second transistor for transmitting a second power-source-level large-amplitude output signal, a PMOS-side power-source control unit including third and fourth transistors, and an NMOS-side power-source control unit including fifth and sixth transistors. Where the first transistor is turned on, the third transistor is turned on, the third transistor is turned off after the second power-source-level large-amplitude output signal is caused to transition to the first power-source-level large-amplitude output signal, and the fourth transistor is turned on. Further, where the second transistor is turned on, the fifth transistor is turned off after the first power-source-level large-amplitude output signal is caused to transition to the second power-source-level large-amplitude output signal, and the sixth transistor is turned on.

Preferably, in the level-conversion circuit, each of the third and sixth transistors is turned on after the first power-source-level large-amplitude output signal is caused to transition to the second power-source-level large-amplitude output signal.

Further, each of the fourth and fifth transistors may be turned on after the second power-source-level large-amplitude output signal is caused to transition to the first power-source-level large-amplitude output signal.

Preferably, the level-conversion circuit may further comprise a PMOS-driver control unit for receiving a third power-source-level small-amplitude input signal and a fourth power-source-level small-amplitude input signal, and an NMOS-driver control unit for receiving the third power-source-level small-amplitude input signal and the fourth power-source-level small-amplitude input signal. The PMOS-driver control unit may transmit an output signal of the fourth power-source level, upon receiving the third power-source-level small-amplitude input signal, and transmit an output signal of the first power-source level, upon receiving the fourth power-source-level small-amplitude input signal. Further, the NMOS-driver control unit may transmit an output signal of the third power-source level, upon receiving the fourth power-source-level small-amplitude input signal, and transmit an output signal of the second power-source level, upon receiving the third power-source-level small-amplitude input signal.

Preferably, in the level-conversion circuit, the PMOS-driver control unit may comprise a seventh transistor for transmitting the fourth power-source-level output signal, and an eighth transistor for transmitting the first power-source-level output signal. Where the fourth power-source-level output signal is transmitted, the eighth transistor may be turned off. Where the first power-source-level output signal is transmitted, the seventh transistor may be turned off. The NMOS-driver control unit may comprise a ninth transistor for transmitting the third power-source-level output signal, and a tenth transistor for transmitting the second power-source-level output signal. Where the third power-source-level output signal is transmitted, the tenth transistor may be turned off. Further, where the second power-source-level output signal is transmitted, the ninth transistor may be turned off.

Preferably, in the level-conversion circuit, the PMOS-driver control unit may be separated from a first power source and the NMOS-driver control unit may be separated from a second power source by using an activation signal and/or a non-activation signal.

A semiconductor circuit according to another aspect of the present invention comprises at least one of the above-described level-conversion circuits.

A semiconductor circuit according to another aspect of the present invention comprises a driver circuit for generating a third power-source-level signal and a fourth power-source-level signal, a buffer circuit that receives and converts the third power-source-level signal and the fourth power-source-level signal into a first power-source-level signal and a second power-source-level signal and that transmits the converted signals, as the third power-source-level signal and the fourth power-source-level signal, and a level-conversion circuit that receives and converts the third power-source-level signal and the fourth power-source-level signal that are transmitted from the buffer circuit into the first power-source-level signal and the second power-source-level signal.

According to the present invention, an independent control signal is transmitted to each of a driver control unit and an output transistor, so as to prevent the driver control unit and the output transistor from being made to operate at the same time and reduce through-current flows. Further, since the transistor ratio can be selected easily, the degree of designing flexibility increases and the speed enhancement is achieved. Accordingly, a level-conversion circuit that consumes a small amount of power and that operates with high speed can be obtained. Further, a semiconductor circuit including the level-conversion circuit can be obtained.

DESCRIPTION OF THE PREFERRED EMBODIMENTS

Level-conversion circuits of the present invention will now be described with reference to the attached drawings.

First Embodiment

Figure 6:
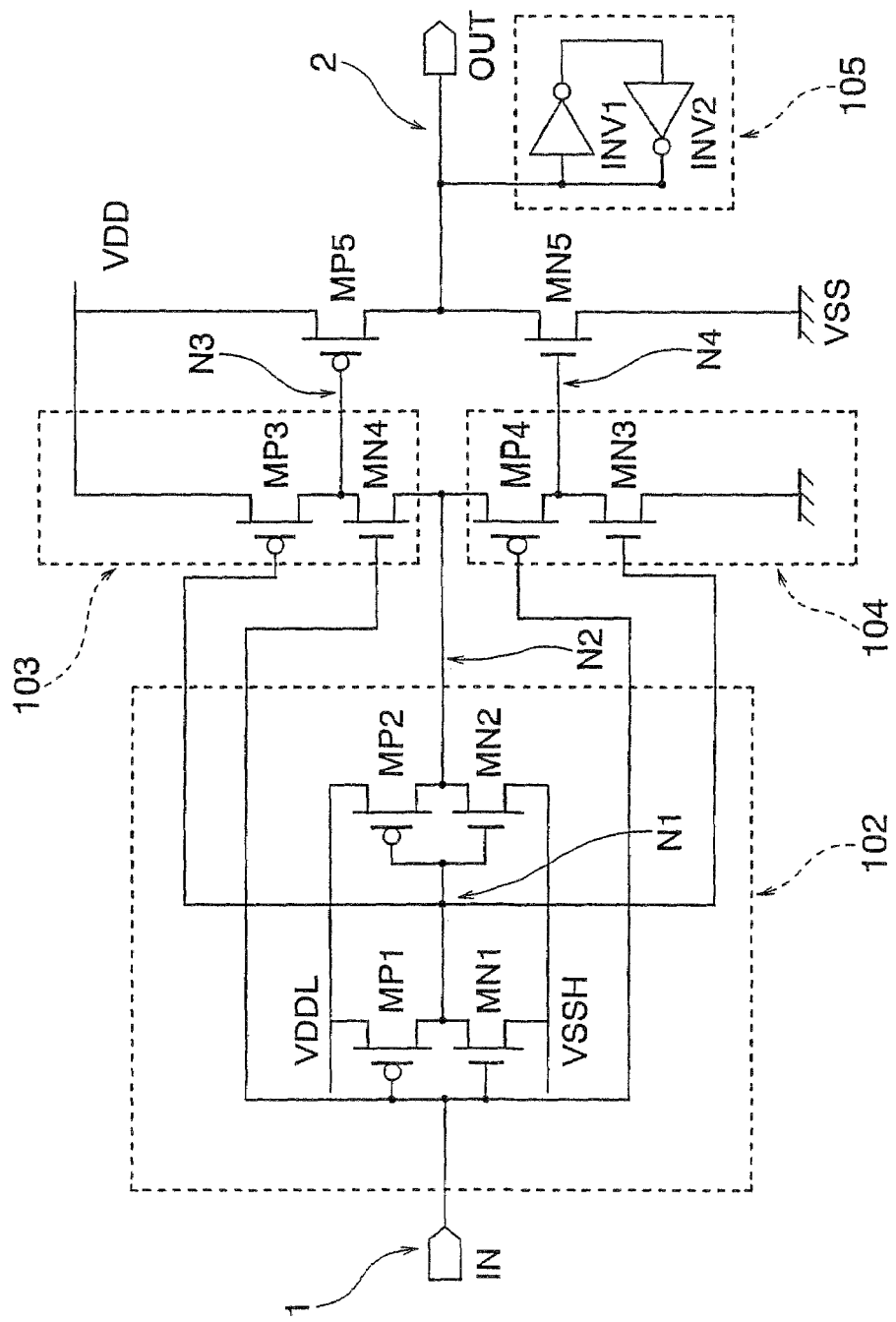
FIG. 6 shows the configuration of a level-conversion circuit according to a first embodiment of the present invention.

A first embodiment of the present invention will be described in detail with reference to FIGS. 6 and 7. FIG. 6 shows a level-conversion circuit of this embodiment. A small-amplitude-level voltage inputted thereto includes a high-level voltage VDDL lower than a power-source voltage and a low-level voltage VSSH higher than a ground voltage, where an expression VDDL>VSSH holds. The level-conversion circuit comprises an input terminal 1, an input-timing control unit 102, a PMOS-driver control unit 103, an NMOS-driver control unit 104, an output-transistor MP5, an output-transistor MN5, a data-holding unit 105, and an output terminal 2.

The input-timing control unit 102 includes a first-stage inverter having a PMOS transistor MP1 and an NMOS transistor MN1, where the transistors MP1 and MN1 operate by a power-source voltage VDDL to VSSH and receive an input signal IN. The input-timing control unit 102 further includes a next-stage inverter having a PMOS transistor MP2 and an NMOS transistor MN2, where the transistors MP2 and MN2 operate by the power-source voltage VDDL to VSSH and receive the input signal IN. In the first-stage inverter, the source of the PMOS transistor MP1 is connected to the voltage VDDL, the gate thereof is connected to the input signal IN, and the drain thereof is connected to a node N1. Further, the source of the NMOS transistor MN1 is connected to the voltage VSSH, the gate thereof is connected to the input signal IN, and the drain thereof is connected to the node N1. The input signal IN is inverted and the inverted signal is transmitted to the node N1. The inverted signal is further transmitted to the next-stage inverter (the transistors MP2 and MN2) and the gates of transistors MP3 and MN3. In the next-stage inverter, the source of the PMOS transistor MP2 is connected to the voltage VDDL, the gate thereof is connected to the node N1, and the drain thereof is connected to a node N2. Further, the source of the NMOS transistor MN2 is connected to the voltage VSSH, the gate thereof is connected to the node N1, and the drain thereof is connected to the node N2. The next-stage inverter receives a signal transmitted from the node N1 functioning as an output end of the first-stage inverter and transmits the output signal to the sources of a PMOS transistor MP4 and an NMOS transistor MN4, as a signal node-N2.

The PMOS-driver control unit 103 includes the PMOS transistor MP3 and the NMOS transistor MN4. The source of the PMOS transistor MP3 is connected to a power-source voltage VDD, the gate thereof is connected to the node N1, and the drain thereof is connected to a node N3. The source of the NMOS transistor MN4 is connected to the node N2, the gate thereof is connected to the input signal IN, and the drain thereof is connected to the node N3. The PMOS-driver control unit 103 transmits its output signal to the gate of an output transistor MP5, as a signal node-N3. The NMOS-driver control unit 104 includes the NMOS transistor MN3 and the PMOS transistor MP4. The source of the NMOS transistor MN3 is connected to a ground voltage, the gate thereof is connected to the node N1, and the drain thereof is connected to a node N4. The source of the PMOS transistor MP4 is connected to the node 2, the gate thereof is connected to the input signal IN, and the drain thereof is connected to the node N4. The NMOS-driver control unit 104 transmits its output signal to the gate of an output transistor MN5, as a signal node-N4. Here, the PMOS transistor MP3 and the NMOS transistor MN3 are formed, as transistors that have a small capacity, so as to precharge the nodes N3 and N4. Here, expressions MP3<<MN4 and MN3<<MP4 hold. In this event, each of the transistors MP3, MN3, MP4, and MN4 has a low threshold value (a low voltage Vt).

The source of the output transistor MP5 is connected to the power-source voltage VDD, the gate thereof is connected to the node N3, and the drain thereof is connected to an output OUT. The source of the output transistor MN5 is connected to a ground voltage VSS, the gate thereof is connected to the node N4, and the drain thereof is connected to the output OUT. The data holding unit 105 is provided, as a holding circuit for holding output data. The holding unit 105 includes an inverter circuit INV1 and an inverter circuit INV2. The inverter circuit INV1 uses the output OUT, as its input end. The inverter circuit INV2 uses the output end of the inverter circuit INV1, as its input end, and transmits its output signal to the output OUT, that is to say, the input end of the inverter circuit INV1.

The output transistors MP5 and MN5 are separately controlled by the PMOS-driver control unit 103 and the NMOS-driver control unit 104. The input-signal timing control unit 102 controls the operation timing of the PMOS-driver control unit 103 and the NMOS-driver control unit 104. The node N3 generates a one-shot low signal and turns on the output-transistor MP5, only when the level of the input signal IN is high, and the node N4 generates a one-shot high signal and turns on the output-transistor MN5, only when the level of the input signal IN is low. Thus, according to the above-described configuration, the output-transistors MP5 and MN5 are prevented from being turned on at the same time by selecting a suitable one-shot-signal width. As a result, the output OUT is caused to transition with high speed.

The data holding unit 105 is provided for holding the output data over a period of time during the output transistors MP5 and MN5 are turned off. Further, in order to generate the one-shot signal, the signal node-N2 generated by delaying the input signal IN by the input-timing control unit 102 is transmitted to the sources of the NMOS transistor MN4 and the PMOS transistor MP4. Consequently, the NMOS transistor MN4 is turned on only over a period of time during the level of the input signal IN is high and the level of the signal node-N2 is low, so that the node N3 is caused to transition to the low level. The PMOS transistor MP4 is turned on only over a period of time during the level of the input signal IN is low and the level of the signal node-N2 is high, so that the node N4 is caused to transition to the high level. Over the other periods of time, the inverted signal N1 generated by delaying the input signal IN is transmitted to the gate of each of the PMOS transistor MP3 and the NMOS transistor MN3. Thus, the node N3 is precharged to a high level and the node N4 is precharged to a low level. Therefore, the pulse width of the one-shot signal corresponds to the delay amount of the input-timing control unit 102.

The source voltage and gate voltage of the PMOS transistor MP3 are determined to be the voltage VDD and the voltage VDDL, respectively. Therefore, where a predetermined voltage satisfying an expression |Vt|<|VDD−VDDL| is selected, the voltage of the node N3 is maintained at the VDD level and floating is prevented from occurring. Similarly, where the threshold value Vt of the NMOS transistor MN3 is determined so that an expression Vt<VSSH−VSS holds, the voltage of the node N4 is maintained at the VSS level and floating is prevented from occurring. The capacities of the PMOS transistor MP3 and the NMOS transistor MN3 are determined to be sufficiently smaller than those of the NMOS transistor MN4 and the PMOS transistor MP4. Consequently, where the NMOS transistor MN4 and the PMOS transistor MP4 are turned on, the PMOS transistor MP3 and the NMOS transistor MN3 are slightly turned on for maintaining the node potential. The one-shot signals of the nodes N3 and N4 fall and rise with high speed. Further, upon receiving the signal transmitted from the node N1, the PMOS transistor MP3 and the NMOS transistor MN3 enter the ON-state, and the PMOS transistor MP4 and the NMOS transistor MN4 enter the OFF-state upon receiving the signal transmitted from the node N2, so that the nodes N3 and N4 rise and fall with high speed. Thus, the one-shot signals of the nodes N3 and N4 can operate with high speed.

Further, low voltages Vt are used for the PMOS transistor MP4 and the NMOS transistor MN4 for increasing the circuit-operation speed. Still further, low voltages Vt are used for the PMOS transistor MP3 and the NMOS transistor MN3 for obtaining the precharge capacity. However, the use of low voltages Vt may become unnecessary according to the small-amplitude-signal level. Specifically, the entire transistors can be formed, as normal transistors. In this embodiment, the input-timing control unit 102 includes the first-stage inverter and the next-stage inverter with a small capacity. However, the present invention may be achieved without being limited to the above-described configuration, so long as the timing of the input signal IN can be delayed.

Figure 1A:
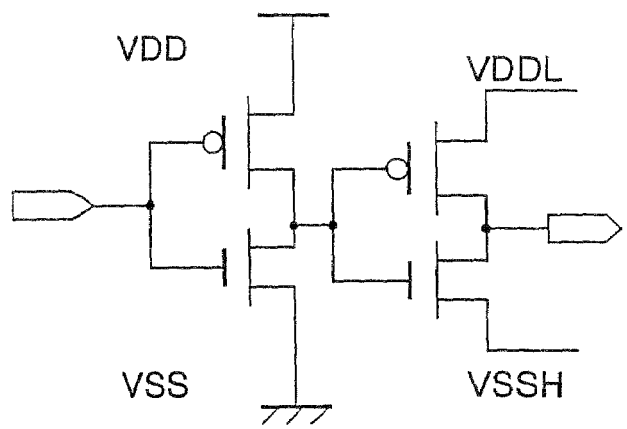
FIG. 1A shows the configuration of a related driver circuit.
Figure 1B:
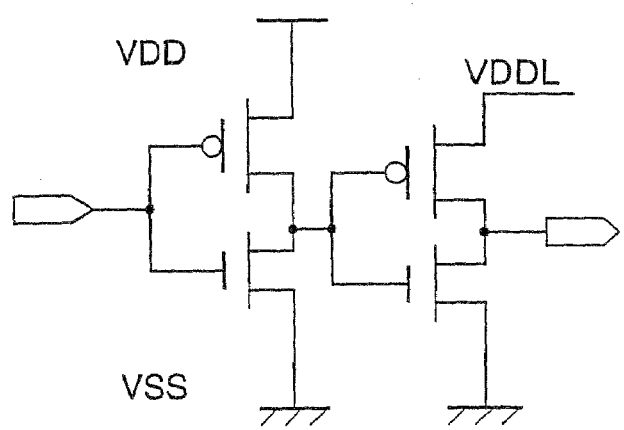
FIG. 1B shows the configuration of another related driver circuit.
Figure 1C:
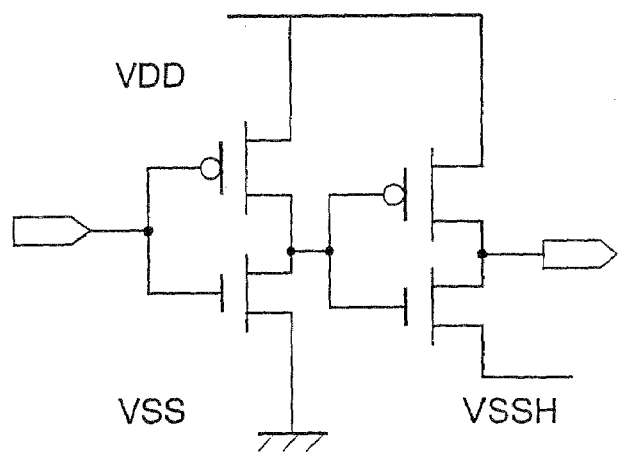
FIG. 1C shows the configuration of another related driver circuit.
Figure 2A:
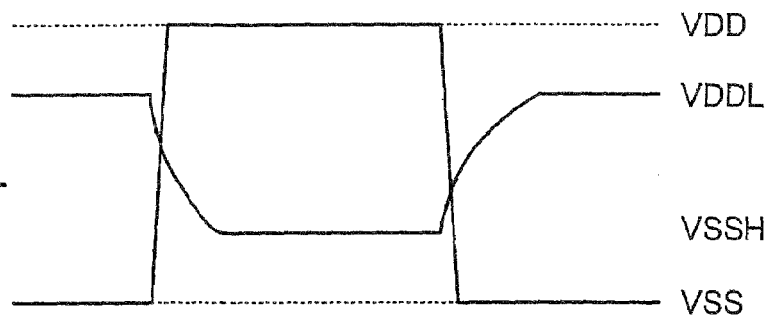
FIG. 2A shows the waveform of the related driver circuit shown in FIG. 1A.
Figure 2B:
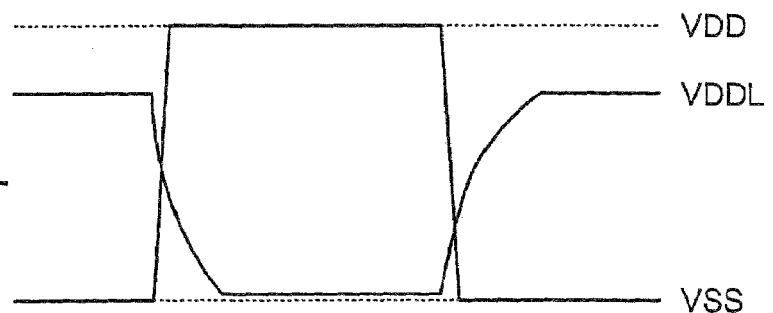
FIG. 2B shows the waveform of the related driver circuit shown in FIG. 1B.
Figure 2C:
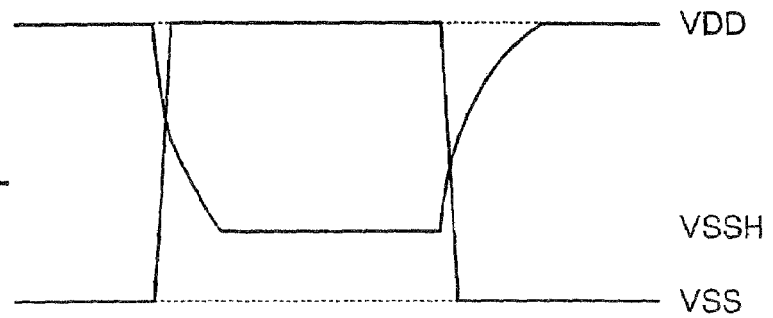
FIG. 2C shows the waveform of the related driver circuit shown in FIG. 1C.
Figure 3:
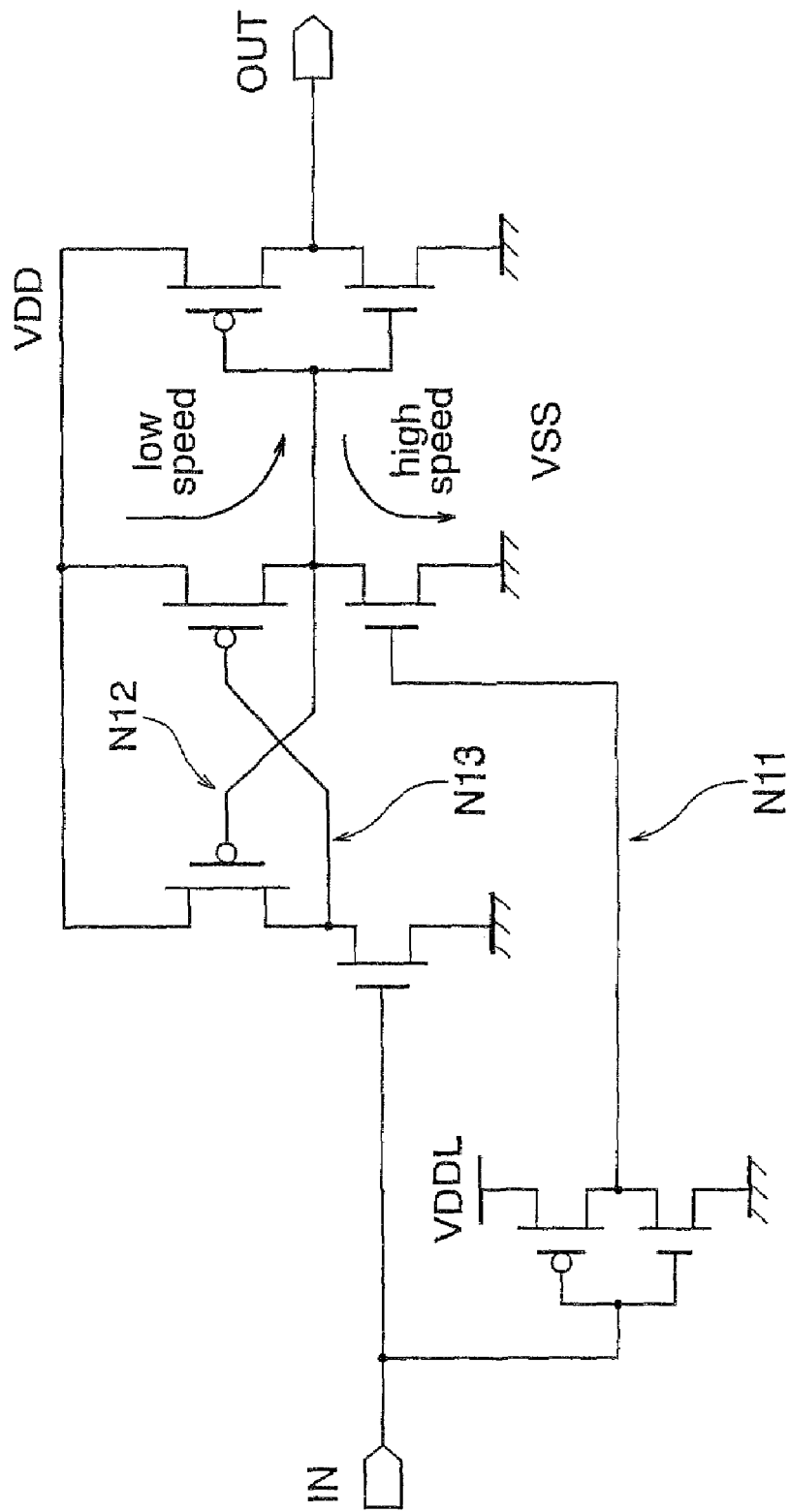
FIG. 3 shows the configuration of a first known level-conversion circuit.
Figure 4:
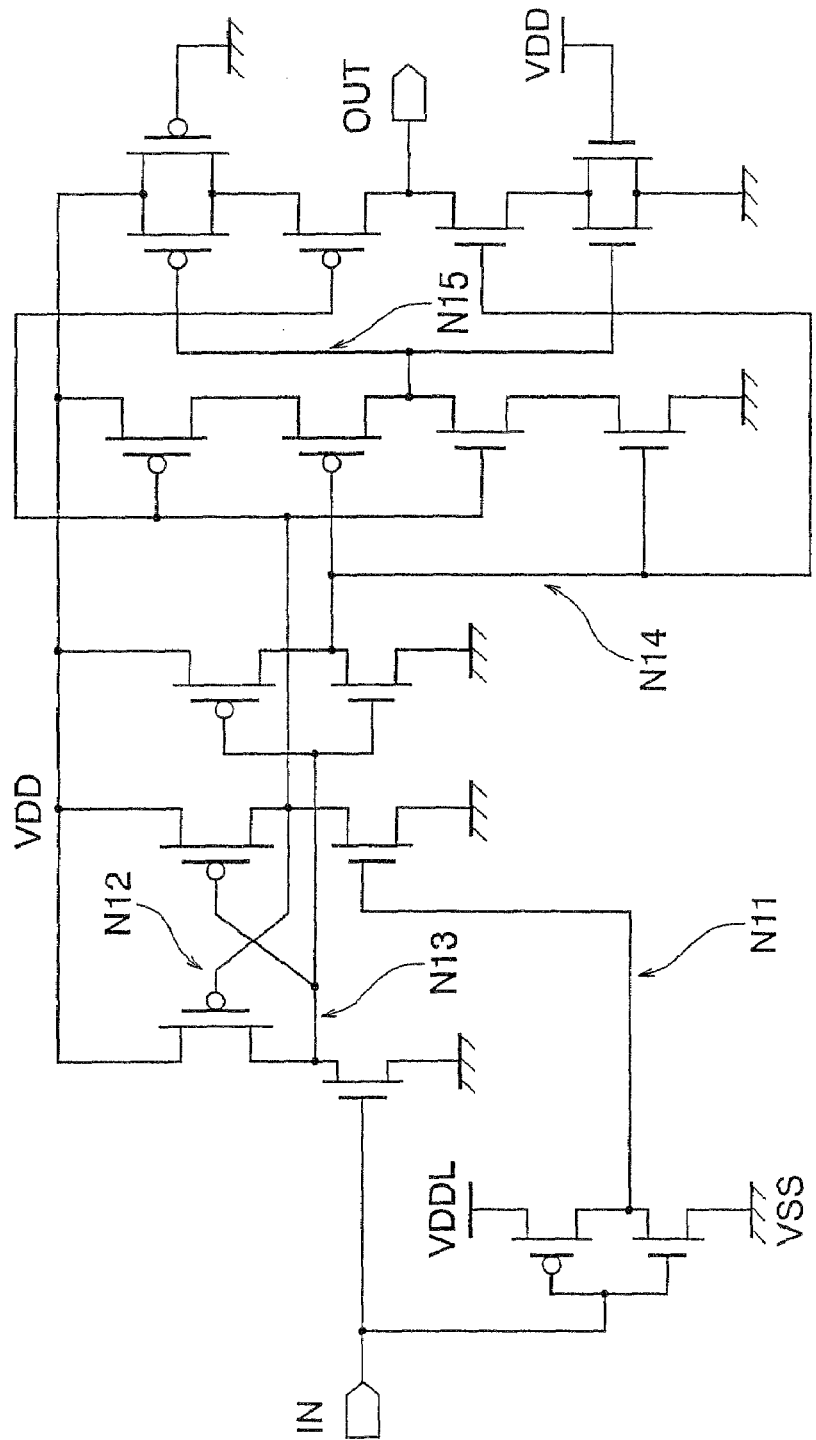
FIG. 4 shows the configuration of a second known level-conversion circuit.
Figure 5:
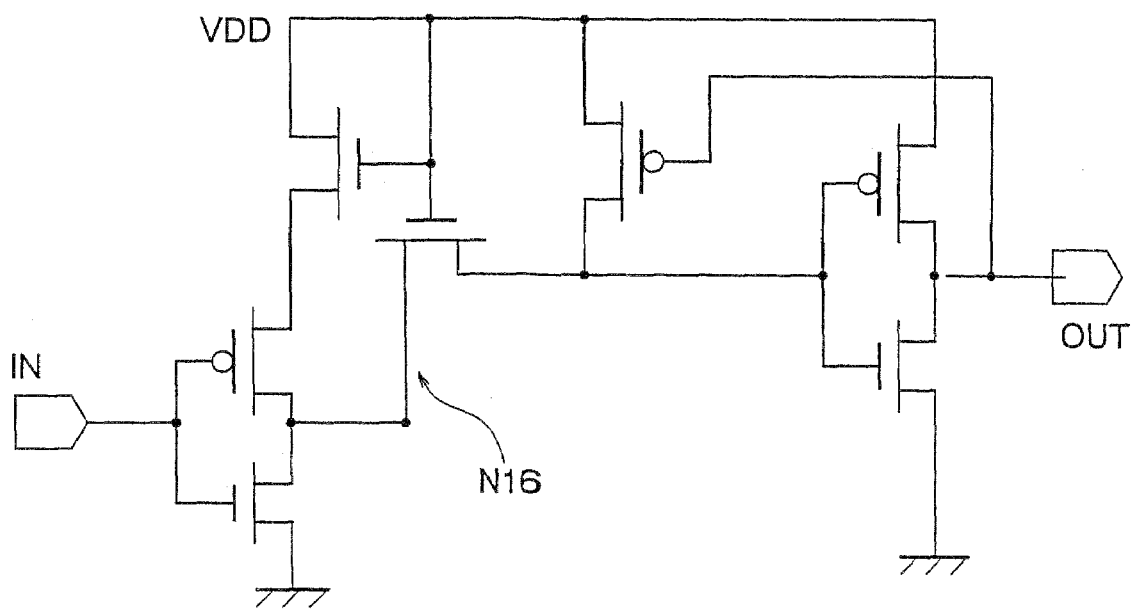
FIG. 5 shows the configuration of a third known level-conversion circuit.
Figure 7:
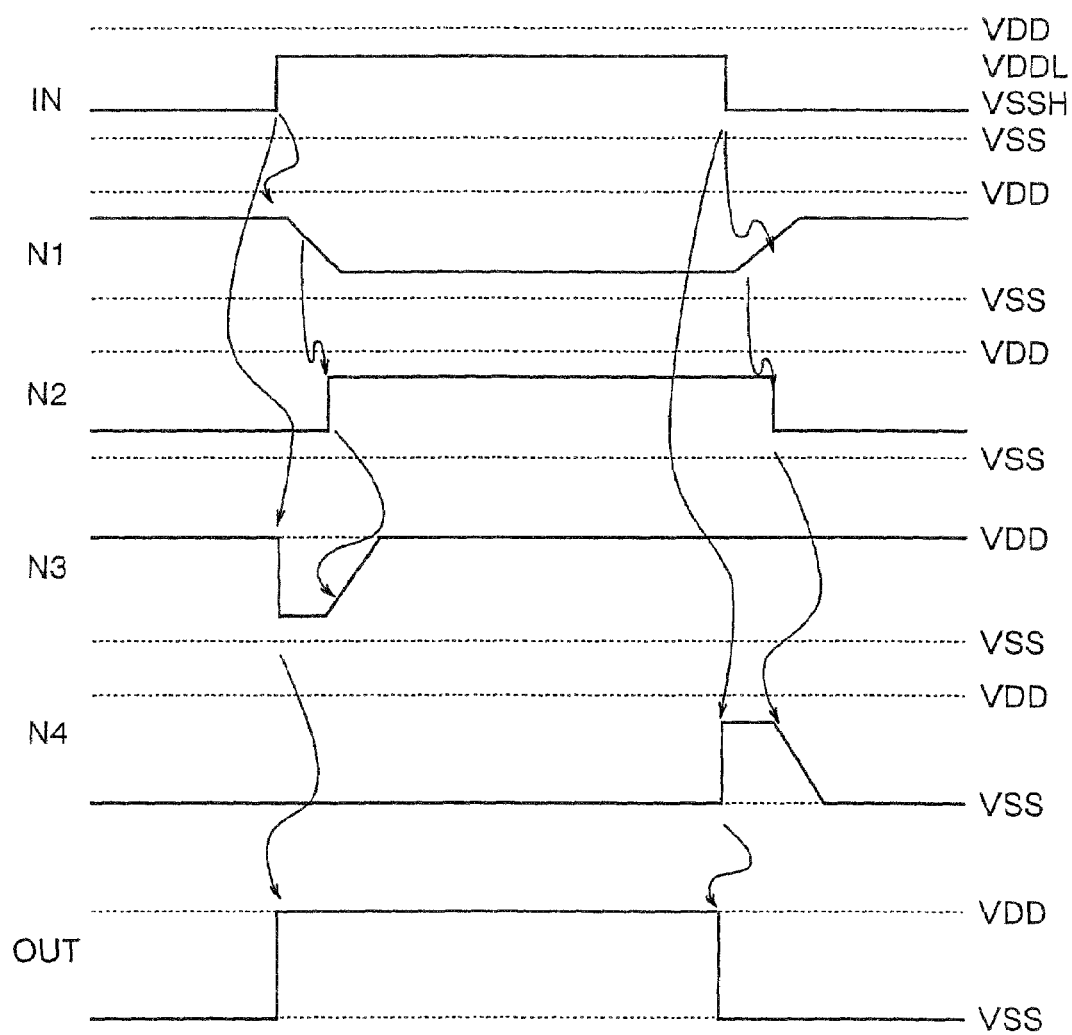
FIG. 7 shows the waveform of the level-conversion circuit of the first embodiment.

Next, the operations of the level conversion circuit shown in FIG. 1 will be described with reference to FIG. 7 illustrating the input timing. Where the input signal IN is caused to transition from the voltage VSSH (>VSS) to the voltage VDDL (<VDD), the PMOS transistor MP1 and the NMOS transistor MN1 transmit a predetermined signal created by delaying the timing of the input signal IN and inverting the input signal IN to the node N1. Then, the PMOS transistor MP2 and the NMOS transistor MN2 transmit the signal node-N2 created by delaying the input signal IN of the node N1. Since the voltage VDDL and the voltage VSSH are used for the signal node-N1 and the signal node-N2, as power sources, output signals transmitted from the nodes N1 and N2 perform the VDDL operation and the VSSH operation. Although the input signal IN is directly transmitted to the NMOS transistor MN4, the NMOS transistor MN4 changes from the OFF-state to the ON-state, so as to draw a predetermined number of electrical charges from the node N3. Consequently, the level of the node N3 becomes low (VSSH).

Where the node N2 changes from the low level to the high level, the NMOS transistor MN4 is turned off. However, since the node N1 is switched from the high level (VDDL) to the low level (VSSH) at about the same time, the node N3 is precharged to the VDD level. Upon receiving the voltage of the node N3, the PMOS transistor MP5 is turned on and the output OUT is caused to transition from the low level to the high level. Since the node N4 is maintained at the low level then, the NMOS transistor MN5 remains turned off. Specifically, the NMOS transistor MN5 remains turned off over a time period during the PMOS transistor MP5 is turned on. Therefore, no through-current flows are generated in this path.

Where the input signal IN is caused to transition from the voltage VDDL (<VDD) to the voltage VSSH (>VSS), the input signal IN is directly transmitted to the PMOS transistor MP4. At this time, the PMOS transistor MP4 is switched from the OFF state to the ON state so that the node N4 is charged to a high level (VDDL). When the node N2 is switched from the high level to the low level, the PMOS transistor MP4 is turned off. However, since the node N1 is switched from the low (VSSH) level to the high (VDDL) level at about the same time, a predetermined number of electrical charges is drawn from the node N4 so that the level of the node N4 is decreased to the low (VSS) level. Upon receiving the voltage of the node N4, the NMOS transistor MN5 is turned on and the output OUT is caused to transition from the high level to the low level. Since the node N3 is maintained at the high level then, the PMOS transistor MP5 remains turned off. Specifically, the PMOS transistor MP5 remains turned off over a period of time during the NMOS transistor MN5 is turned on. Therefore, no through-current flows are generated in this path.

Thus, according to the above-described embodiment, an input signal, a delayed and inverted input signal, and a delayed input signal are transmitted to the PMOS and NMOS driver control units 103 and 104. Further, the ON state and the OFF state of the transistors of the driver circuits are separately controlled. Consequently, the PMOS and NMOS driver control units 103 and 104 generate no through-current flows and operate with high speed. Further, since signals generated by the PMOS and NMOS driver control units 103 and 104 are transmitted to the transistors of the output unit, the transistors can be controlled separately. Thus, the output unit generates no through-current flows and operates with high speed.

Second Embodiment

Figure 8:
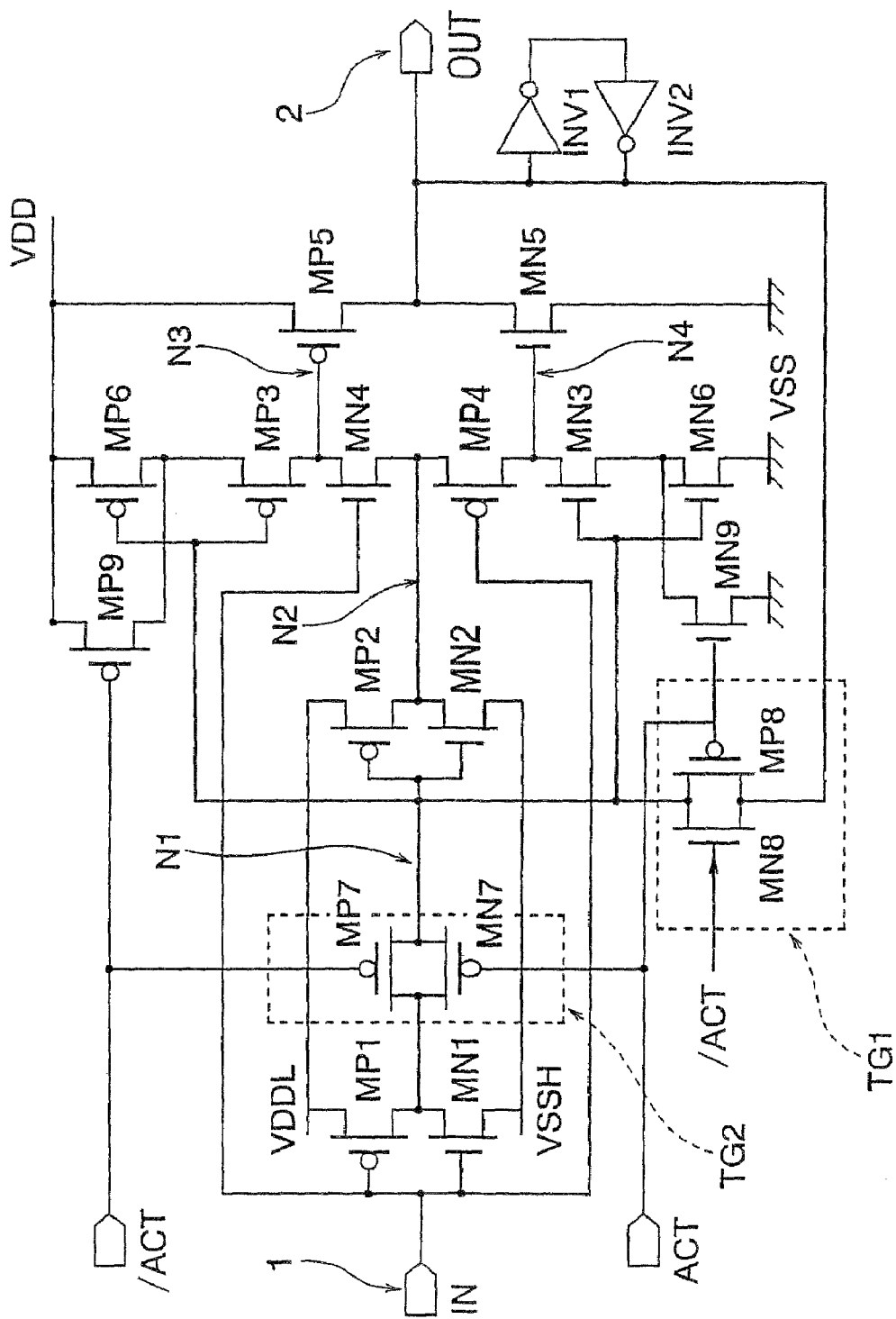
FIG. 8 shows the configuration of a level-conversion circuit according to a second embodiment of the present invention.

A second embodiment of the present invention will now be described in detail with reference to FIG. 8. In this drawing, an example level-conversion circuit of this embodiment is shown. The operations of the level-conversion circuit of this embodiment are almost the same as those of the level-conversion circuit of the first embodiment. However, in the first embodiment, low voltages Vt are used for the transistors MP3, MN3, MP4, and MN4 for increasing the operation speed. As a result, where the threshold value of each of the transistors using low voltages Vt is depressed or significantly low, a current Ioff (a sub-threshold leak current) is generated, even though the voltage Vgs is 0 V. Where only one level-conversion circuit is provided, the current Ioff is negligible. However, in the case of a VLSI circuit including a plurality of the above-described level-conversion circuits, the total value of the above-described leak currents is often significantly high. In this embodiment, therefore, the level-conversion circuit is provided with measures against the sub-threshold leak currents.

Where the level of a signal ACT functioning as an external control signal is high and the level-conversion circuit operates, the sub-threshold leak current is acceptable. However, where the level of the ACT signal is low and the level-conversion circuit does not operate, namely, where the level-conversion circuit stays in the standby state, the level-conversion circuit is controlled, so as to cut the sub-threshold leak current.

In comparison to the level-conversion circuit of the first embodiment, an activation signal ACT and a signal /ACT generated by inverting the activation signal ACT is transmitted to the level-conversion circuit of this embodiment, as an additional control signal. Further, the following circuits are added to the level-conversion circuit of this embodiment. More specifically, a transfer switch TG1 including a PMOS transistor MP8 and an NMOS transistor MN8 is inserted between the node N1 and the output OUT Further, a transfer switch TG2 including a PMOS transistor MP7 and an NMOS transistor MN7 is inserted between the node N1 and the transistors MP1 and the MN1. Still further, PMOS transistors MP6 and MP9 are inserted in parallel between the PMOS transistor MP3 and the power-source voltage VDD. The gate of the PMOS transistor MP6 is connected to the node N1 and the gate of the PMOS transistor MP9 is connected to the inverted-activation signal /ACT.

Moreover, the NMOS transistors MN6 and NM9 are inserted in parallel between the NMOS transistor MN3 and the ground voltage VSS. The gate of the NMOS transistor MN6 is connected to the node N1 and the gate of the NMOS transistor MN9 is connected to the activation signal ACT Where the level of the signal ACT is high, the transfer switch TG2 is turned on and outputs transmitted from the PMOS transistor MP1 and the NMOS transistor MN1 are connected to the node N1. Conversely, where the level of the signal ACT is low, the transfer switch TG2 is turned off, and the node N1 is connected to the output OUT via the transfer switch TG1. Where the level of the signal ACT is high, the transfer switch TG1 remains turned off. However, where the level of the signal ACT is low, the transfer switch TG1 is selected, so as to connect the output OUT to the node N1. Where the level of an externally transmitted signal ACT is low, the level-conversion circuit does not operate and stays in the standby state. In that state, the level-conversion circuit is controlled, so as to cut the sub-threshold leak current.

Description will be made of the second embodiment with reference to the circuit illustrated in FIG. 8.

Where the level of the activation signal ACT is high, which means that the level of the non-activation signal /ACT is low, the transfer switch TG2 is turned on and the transfer switch TG1 is turned off. Since the signal node-N1 is transmitted to each of the gates of the PMOS transistor MP6 and the NMOS transistor MN6, the PMOS transistor MP6 and the NMOS transistor MN6 are turned on and off, as is the case with the PMOS transistor MP3 and the NMOS transistor MN3. However, since the PMOS transistor MP9 and the NMOS transistor MN9 remain turned on and the PMOS transistor MP3 and the NMOS transistor MN3 are connected to their power sources, respectively, the circuit configuration and operations of this embodiment becomes the same as those of the first embodiment. Therefore, the operations of the level-conversion circuit of this embodiment will not be described.

Where the level of the activation signal ACT is low, which means that the level of the non-activation signal /ACT is high, the PMOS transistor MP9 and the NMOS transistor MN9 remain turned off, the transfer switch TG2 including the PMOS transistor MP7 and the NMOS transistor MN7 remains turned off, and the transfer switch TG1 including the PMOS transistor MP8 and the NMOS transistor MN8 remains turned on. A signal transmitted from the first-stage inverter circuit including the PMOS transistor MP1 and the NMOS transistor MN1 is interrupted, so that a short circuit occurs between the output OUT and the node N1. For example, where the level of the output OUT is low, the level of the signal node-N1 becomes low, so that the signal node N1 is transmitted to each of the gates of the PMOS transistors MP6 and MP3, and the NMOS transistors MN3 and MN6. The PMOS transistors MP6 and MP3 are turned on and the NMOS transistors MN3 and MN6 are turned off. Since the threshold value of the NMOS transistor MN3 is low, the sub-threshold leak current may occur even though the NMOS transistor MN3 is turned off. However, since the NMOS transistor MN6 is turned off, no leak currents are generated between the power-source voltage VDD and the ground voltage VSS.

Further, where the level of the output OUT is high, the level of the signal node-N1 becomes high so that the signal node N1 is transmitted to each of the gates of the PMOS transistors MP6 and MP3, and the NMOS transistors MN3 and MN6. The PMOS transistors MP6 and MP3 are turned off and the NMOS transistors MN3 and MN6 are turned on. Since the threshold value of the PMOS transistor MP3 is low, the sub-threshold leak current may occur even though the PMOS transistor MP3 is turned off. However, since the PMOS transistor MP6 is turned off, no leak currents are generated between the power-source voltage VDD and the ground voltage VSS.

Where the input signal IN is caused to transition and the ON state and OFF state of the NMOS transistor MN4 and the PMOS transistor MP4 are changed during the level-conversion circuit is in the standby state, either the PMOS transistor MP6 or the NMOS transistor MN6 between the power-source voltage VDD and the ground voltage VSS is turned off due to a signal transmitted from the output OUT. Therefore, the level of the node N3 and/or the node N4 is not changed and the output level stays in the latched state.

As described above, where the level-conversion circuit is in the standby state, the signal ACT is kept at the low level, which means that the signal /ACT is kept at the high level. Consequently, the sub-threshold leak currents can be cut while the output data is held. Although the signal OUT is fed back to the node N1 in this embodiment, any signals that operate as the signal OUT does can be used, as the signal fed back to the node N1. Further, according to this embodiment, the PMOS transistors MP6 and MP9, and the NMOS transistors MN6 and MN9 are provided, as the measures against the sub-threshold leak currents generated by the PMOS transistor MP3 and the NMOS transistor MN3. However, where the PMOS transistor MP3 and the NMOS transistor MN3 generate no sub-threshold leak currents, the PMOS transistors MP6 and MP9, and the NMOS transistors MN6 and MN9 are unnecessary.

This embodiment allows for cutting the sub-threshold leak currents that are generated, where the low voltage Vt is used for the above-described transistors. Therefore, the threshold value of the voltage Vt can be decreased, so as to be lower than that of the first embodiment. Thus, the operation speed of the level-conversion circuit of this embodiment can be further increased.

Third Embodiment

Figure 9:
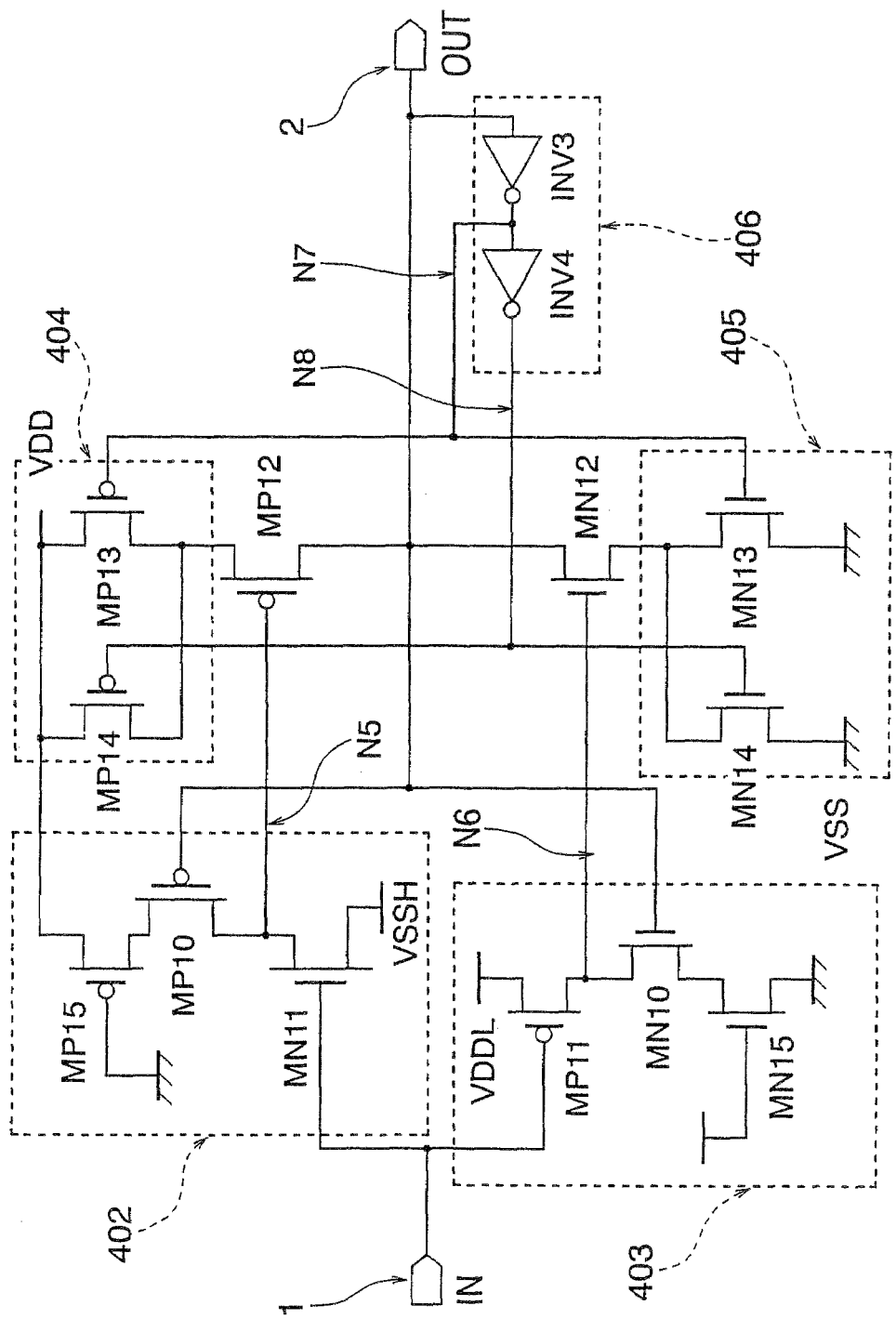
FIG. 9 shows the configuration of a level-conversion circuit according to a third embodiment of the present invention.
Figure 10:
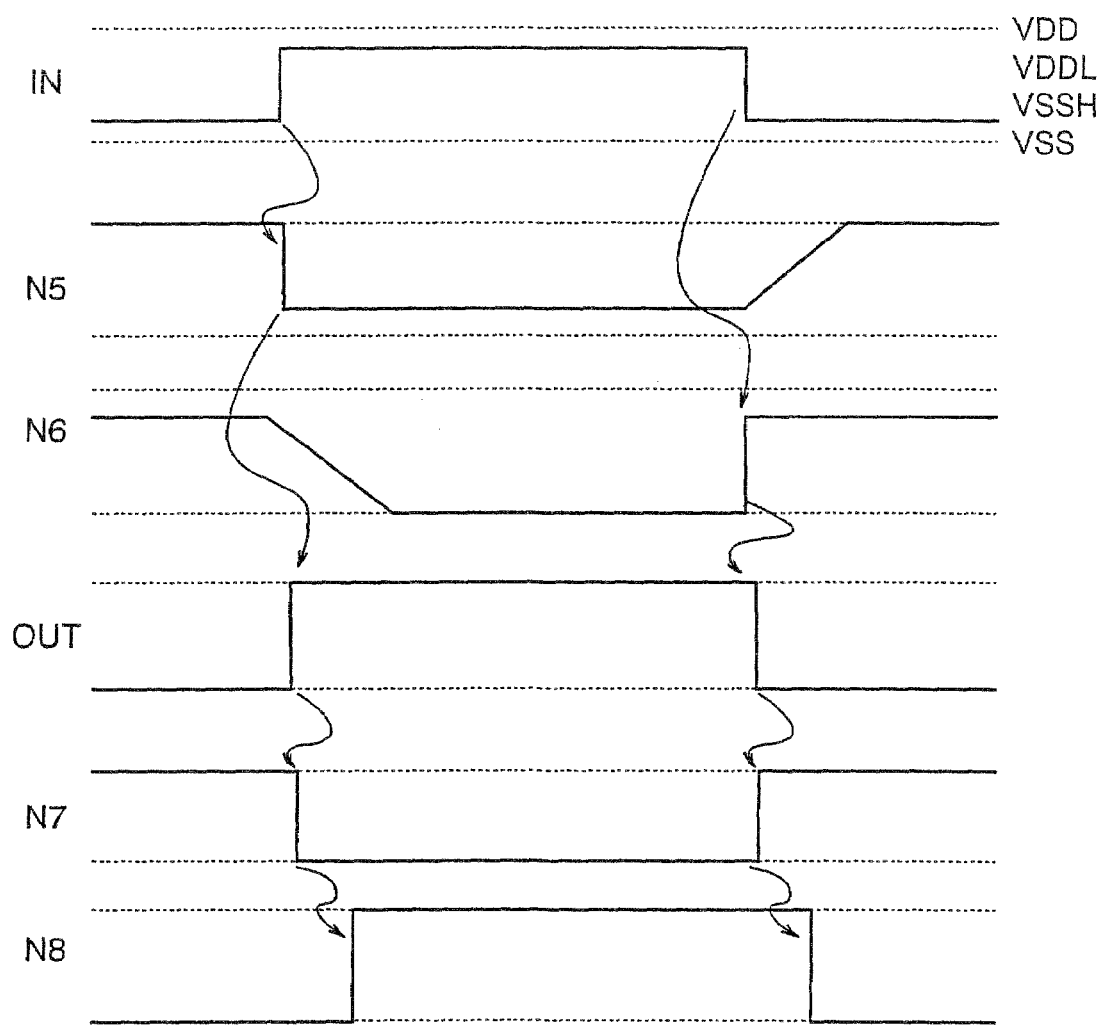
FIG. 10 shows the waveform of the level-conversion circuit of the third embodiment.

Next, a third embodiment of the present invention will now be described in detail with reference to FIGS. 9 and 10. FIG. 9 shows an example level-conversion circuit of this embodiment. Although the output transistor including the PMOS transistor MP5 and the NMOS transistor MN5 of the first embodiment remains turned off except when the input change occurs, an output transistor including a PMOS transistor MP12 and an NMOS transistor MN12 of this embodiment is driven at all times. Accordingly, the level-conversion circuit of this embodiment does not require the above-described data-holding unit. The level-conversion circuit of this embodiment comprises an input terminal 1 to which an input signal IN is transmitted, a PMOS driver-control unit 402, an NMOS driver-control unit 403, a PMOS-side power-source control unit 404, an NMOS-side power-source control unit 405, the output transistors MP12 and MN12, an output terminal 2 for outputting an output signal OUT, and an output-data feedback unit 406.

The PMOS driver-control unit 402 comprises an NMOS transistor MN11, a PMOS transistor MP10, and a PMOS transistor MP15. The source of the NMOS transistor MN11 is connected to a power source VSSH, the gate thereof is connected to the input signal IN, and the drain thereof is connected to a node N5. The drain of the PMOS transistor MP10 is connected to the node N5, the gate thereof is connected to the output signal OUT, and the source thereof is connected to the drain of the PMOS transistor MP15. The drain of the PMOS transistor MP15 is connected to the source of the PMOS transistor MP10, the gate thereof is connected to a ground voltage VSS, and the source thereof is connected to the power source VDD. Here, the NMOS transistor MN11 is a transistor using a low voltage Vt.

Where the input signal IN is caused to transition from the level VSSH to the level VDDL, the NMOS transistor MN11 is turned on and transmits a source potential VSSH to the node N5. The output signal OUT is a low-level output and the PMOS transistor MP10 is turned on then. However, since the driving capacity of the PMOS transistor MP15 connected to the source side of the PMOS transistor MP10 is reduced, so as to be almost negligible in comparison with the driving capacity of the NMOS transistor MN11, the node N5 is caused to transition to the level VSSH with high speed. Where the level of the output signal OUT is changed to a high level, the PMOS transistor MP10 is turned off.

Where the input signal IN is caused to transition from the level VDDL to the level VSSH, the NMOS transistor NM11 is turned off. At this time, the output signal OUT is a high-level output and the PMOS transistor MP10 remains turned off. The node N5 is maintained at the level VSSH. Since the output signal OUT is changed to a low-level output due to a signal transmitted from the NMOS driver-control unit 403, the PMOS transistor MP10 is turned on and the level of the node N5 is changed to a high level.

The NMOS driver-control unit 403 comprises a PMOS transistor MP11, an NMOS transistor MN10, and an NMOS transistor MN15. The source of the PMOS transistor MP11 is connected to the power source VDDL, the gate thereof is connected to the input signal IN, and the drain thereof is connected to a node N6. The drain of the NMOS transistor MN10 is connected to the node N6, the gate thereof is connected to the output signal OUT and the source thereof is connected to the drain of the NMOS transistor MN15. The drain of the NMOS transistor MN15 is connected to the source of the NMOS transistor MN10, the gate thereof is connected to the power-source voltage VDD, and the source thereof is connected to the ground voltage VSS. Here, the PMOS transistor MP11 is formed, as a transistor using a low voltage Vt.

Where the input signal IN is caused to transition from the level VSSH to the level VDDL, the PMOS transistor MP11 is turned off. At this time, the output signal OUT is a low-level output, the NMOS transistor MN10 remains turned off, and the node N6 is maintained at the level VDDL. Since the output signal OUT is changed to a high-level output due to a signal transmitted from the PMOS driver-control unit 402, the NMOS transistor MN10 is turned on and the level of the node N6 is changed to a low level.

Where the input signal IN is caused to transition from the level VDDL to the level VSSH, the PMOS transistor NP11 is turned on, so that the node N6 is charged to the high level VDDL. At this time, the output signal OUT is a high-level output and the NMOS transistor MN10 remains turned on. However, since the driving capacity of the NMOS transistor MN1 5 connected to the source side of the NMOS transistor MN10 is reduced, so as to be almost negligible in comparison with the driving capacity of the PMOS transistor MP11, the node N6 is caused to transition to the level VDDL with high speed. Where the level of the output signal OUT is changed to a low level, the NMOS transistor MN10 is turned off.

The drain of the output transistor MP12 is connected to the output signal OUT, the gate thereof is connected to the node N5, and the source thereof is connected to the drain of the PMOS transistor MP13. Further, the drain of the output transistor MN12 is connected to the output signal OUT the gate thereof is connected to the node N6, and the source thereof is connected to the drain of the NMOS transistor MN13.

The PMOS-side power-source control unit 404 includes a PMOS transistor MP13 and a PMOS transistor MP14. The drain of the PMOS transistor MP13 is connected to the source of the PMOS transistor MP12, the gate thereof is connected to a node N7, and the source thereof is connected to the power source VDD. The drain of the PMOS transistor MP14 is connected to the source of the PMOS transistor MP12, the gate thereof is connected to a node N8, and the source thereof is connected to the power source VDD. A signal N8 generated by delaying the output signal OUT is transmitted to the gate of the PMOS transistor MP14 and a signal N7 generated by inverting the output signal OUT is transmitted to the gate of the PMOS transistor MP13.

Where the input signal IN is caused to transition from the level VSSH to the level VDDL, the node N5 is caused to transition from the level VDD to the level VSSH with high speed, the PMOS transistor MP12 is turned on, and the level of the output signal OUT is increased to a high level with high speed. During the above-described transition occurs, the PMOS transistor MP14 remains turned on and the PMOS transistor MP13 remains turned off. Since a predetermined transistor satisfying expressions Ids (MP14)>>Ids (MP13) and Ids (MP12)>>Ids (MP13) is used, the PMOS transistor MP14 remains turned on during the node N5 is caused to transition. Subsequently, a large current is transmitted from the power source VDD and the output signal OUT is caused to transition to a high level with high speed. After the transition is finished and the output signal OUT is changed, the PMOS transistor MP14 is turned off and the PMOS transistor MP13 is turned on. Therefore, most of the current-supply capacity is lost, though data can be held therein.

Where the input signal IN is caused to transition from the level VDDL to the level VSSH, the node N5 is caused to transition from the level VSSH to the level VDD. During the above-described transition occurs, the PMOS transistor MP14 remains turned off and the PMOS transistor MP13 remains turned on. Further, a short circuit occurs between the output OUT and the power source VDD via the PMOS transistors MP12 and MP13. However, since most of the current-supply capacity is lost, the NMOS transistors MN14 and MN12 of the NMOS-side power-source control unit 405 are turned on, so that the output OUT is caused to transition to the low level with high speed. Due to the change to the low level, the PMOS transistor MP10 of the PMOS driver-control unit 402 is turned on. Subsequently, the node N5 is charged to the level VDD, and the PMOS transistor MP12 is turned off.

The NMOS-side power-source control unit 405 comprises an NMOS transistor MN13 and an NMOS transistor MN14. The drain of the NMOS transistor MN13 is connected to the source of the NMOS transistor MN12, the gate thereof is connected to the node N7, and the source thereof is connected to the power source VSS. The drain of the NMOS transistor MN14 is connected to the source of the NMOS transistor MN12, the gate thereof is connected to the node N8, and the source thereof is connected to the power source VSS. The signal N8 generated by delaying the output signal OUT is transmitted to the gate of the NMOS transistor MN14 and the signal N7 generated by inverting the output signal OUT is transmitted to the gate of the NMOS transistor MN13.

Where the input signal IN is caused to transition from the level VSSH to the level VDDL, the node N6 is caused to transition from the level VDDL to the level VSS. During the transition occurs, the NMOS transistor MN14 remains turned off and the NMOS transistor MN13 remains turned on. As is the case with the PMOS-side power-source control unit 404, a predetermined transistor satisfying expressions Ids (MN14)>>Ids (MN13) and Ids (MN12)>>Ids (MN13) is used. Subsequently, a short circuit occurs between the output OUT and the power source VSS via the NMOS transistors MN12 and MN13. However, since most of the current-supply capacity is lost, the PMOS transistors MP14 and MN12 of the PMOS-side power-source control unit 404 are turned on, so that the output signal OUT is caused to transition to the high level with high speed. Due to the transition to the high level, the NMOS transistor MN10 of the NMOS driver-control unit 403 is turned on. Subsequently, a predetermined number of electrical charges are drawn from the node N6 so that the level of the node N6 is decreased to the level VSS and the NMOS transistor MN12 is turned off.

Where the input signal IN is caused to transition from the level VDDL to the level VSSH, the PMOS transistor MP11 is turned on, the node N6 is caused to transition from the level VSS to the level VDDL with high speed, the NMOS transistor MN12 is turned on, and the level of the output signal OUT is decreased to a low level with high speed. Since the NMOS transistor MN14 remains turned on during the above-described transition occurs, a large current is supplied, so that the level of the output signal OUT becomes low. After the transition is finished and the output signal OUT is changed, the NMOS transistor MN14 is turned off and the NMOS transistor MN13 is turned on. Therefore, most of the current-supply capacity is lost, though data can be held therein.

The output-data feedback unit 406 includes an inverter circuit INV3 and an inverter circuit INV4. An output signal OUT is input to the inverter circuit INV3. The inverter circuit INV3 transmits an inverted signal N7. Upon receiving the inverted signal N7, the inverter circuit INV4 delays and inverts the input signal, so as to generate and output the signal N8. Further, where the level of the output signal OUT is caused to transition from low to high, the node N7 may preferably turn off the NMOS transistor MN13 with high speed. Conversely, the node N8 needs to be delayed, so as to turn off the PMOS transistor MP17 after the transition of the output signal is finished. In this embodiment, the inverter INV4 functions as delay means. However, the delay means may be achieved by known technologies, without being limited to the above-described one-stage inverter INV4.

In this embodiment, each of the PMOS driver-control unit 402 and the NMOS driver-control unit 403 can rise and fall with high speed. For example, where the NMOS transistor MN11 is turned on, a current transmitted from the power source VDD to the node N5 is negligible in comparison with a current drawn to the power source VSSH, so that the node N5 is caused to transition with high speed. Further, where the PMOS transistor MP12 is turned on, a current transmitted from the output OUT to the NMOS-side power-source control unit 405 is negligible in comparison with a current transmitted from the PMOS-side power-source control unit 404. Therefore, through-current flows are hardly generated between the output transistors MP12 and MN12. As a result, the output transistors MP12 and MN12 can operate with high speed. After the output transistors MP12 and MN12 operate, a current held by the output-data feedback unit 406 is transmitted. Subsequently, the same effect as that of the first embodiment is obtained.

As has been described, according to the configuration of the third embodiment, the on side of drive transistors is designed, so as to be ready for high speed, and the off-side thereof is designed, so as to be ready for low speed. However, since the power source of the driver transistors is controlled, so as to control an output, the same effect as that of the first embodiment can be obtained without using an output-data holding circuit.

Fourth Embodiment

Figure 11:
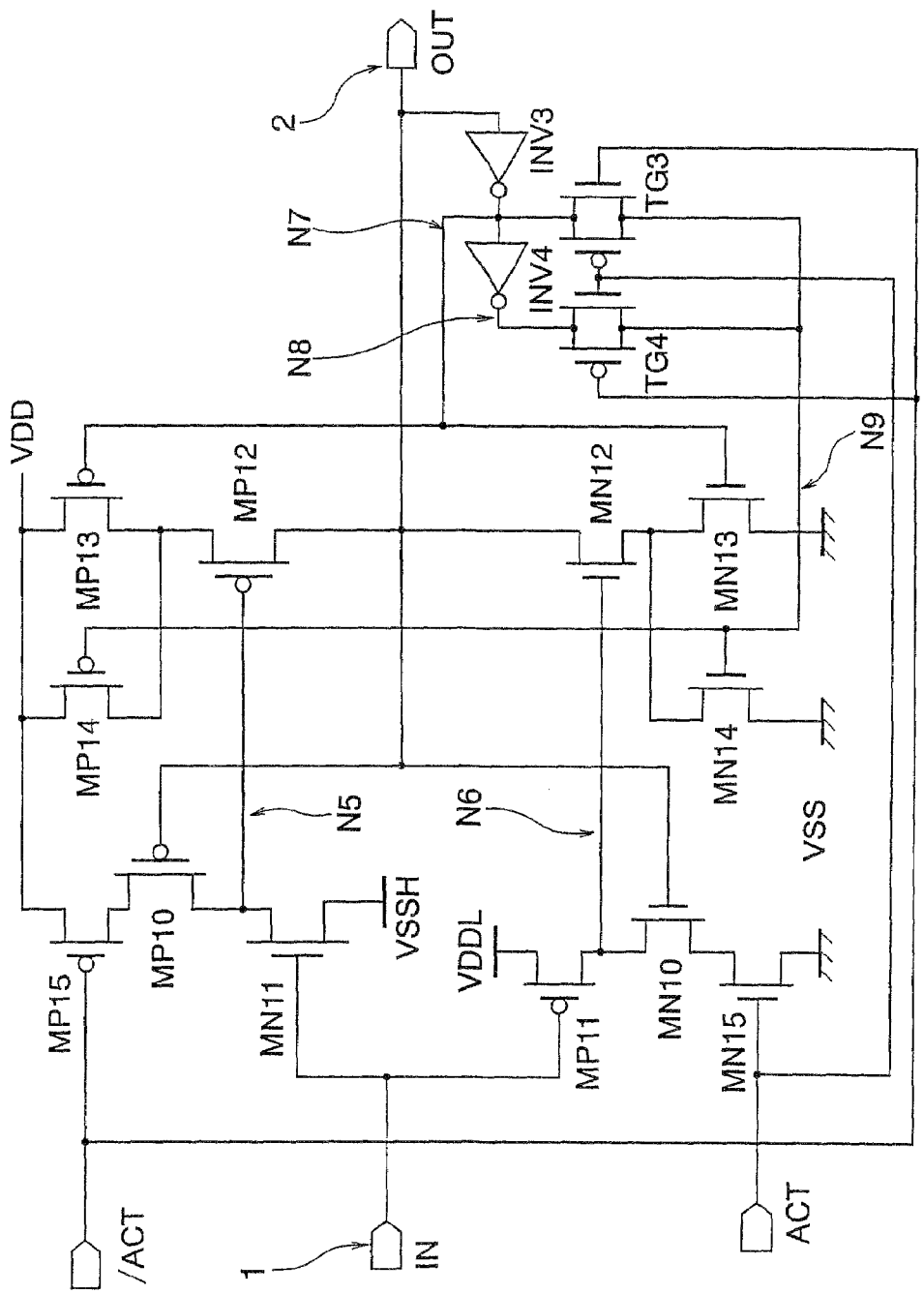
FIG. 11 shows the configuration of a level-conversion circuit according to a fourth embodiment of the present invention.

Next, a fourth embodiment of the present invention will be described in detail with reference to FIG. 11. This drawing shows an example level-conversion circuit of this embodiment. This level-conversion circuit has measures against a sub-threshold leak current, in comparison with the level-conversion circuit of the third embodiment. Further, where the level of a signal ACT that is an external control signal is high, the level-conversion circuit of this embodiment operates and accepts the sub-threshold leak current. Specifically, the level-conversion circuit of this embodiment accepts the sub-threshold leak current, where the level-conversion circuit is in an operation state. Conversely, where the level of the signal ACT is low, the level-conversion circuit does not operate. Specifically, the level-conversion circuit enters the standby state. In the standby state, the level-conversion circuit is controlled, so as to cut the sub-threshold leak current.

The level-conversion circuit of this embodiment is different from that of the third embodiment in that the inverted-activation signal /ACT is transmitted to the gate of the PMOS transistor MP15, the activation signal ACT is transmitted to the gate of the NMOS transistor MN15, and a signal node-N9 is transmitted to each of the gates of the PMOS transistor MP14 and the NMOS transistor MN14. Further, transfer switches TG3 and TG4 are added to the level-conversion circuit of this embodiment. The transfer switch TG3 receives the signal node-N7, as an input signal, and is activated when the level of the inverted-activation signal /ACT is high, so as to transmit the signal node-N7 to the node N9. The transfer switch TG4 receives the signal node-N8, as an input signal, and is activated when the level of the activation signal ACT is high, so as to transmit the signal node-N8 to the node N9.

In this embodiment, the activation signal ACT is transmitted to the NMOS transistor MN15, as an external control signal, and the inverted-activation signal /ACT is transmitted to the PMOS transistor MP15, as a control signal. Where the level of the activation signal ACT is high, the level-conversion circuit operates, as is the case with the third embodiment. However, where the level of the activation signal ACT is low, the level-conversion circuit enters the standby state, in which the PMOS transistor MP15 and the NMOS transistor MN15 are turned off so that currents are cut off. Further, where the level-conversion circuit is in the operation state, a signal node-N8 is used, as a feedback signal transmitted to the PMOS transistor MP14 and the NMOS transistor MN14. However, where the level-conversion circuit is in the standby state, a signal node-N7 is used, as the feedback signal. Specifically, where the level-conversion circuit is in the standby state, the node N7 is connected to each of the gates of the PMOS transistors MP6 and MP7, and the NMOS transistors MN6 and MN7.

Next, operations of the level-conversion circuit of this embodiment will be described. Where the level-conversion circuit is in the operation state (where the level of the activation signal ACT is high and that of the inverted-activation signal is low), the gate of the PMOS transistor MP15 is maintained at a low level and the gate of the NMOS transistor MN15 is maintained at a high level. The node N9 is connected to the node N8 and the transfer gate TG2 is turned on. Since the connection and operations of this embodiment are the same as those of the third embodiment, the operations of this embodiment will not be described.

Where the level-conversion circuit is in the standby state (where the level of the activation signal ACT is low and that of the inverted-activation signal /ACT is high), the PMOS transistor MP15 and the NMOS transistor MN15 are turned off. Since low voltages Vt are used for the NMOS transistor MN11 and the PMOS transistor MP11, the sub-threshold leak current may occur and a standby-leak current may increase, even though a gate-to-source voltage Vgs is 0 volt. However, since the PMOS transistor MP15 and the NMOS transistor MN15 are turned off by the inverted-activation signal /ACT and the activation signal ACT, current paths to the power source VDD and the power source VSS are cut, so that the PMOS and NMOS driver circuits generate no standby leak currents. Further, the transfer gate TG3 is turned on, the node N9 is connected to the node N7, and a signal transmitted from the node 7 is transmitted to each of the PMOS transistors MP13 and MP14 of the PMOS-side power-source control unit 404 and the NMOS transistors MN13 and MN14 of the NMOS-side power-source control unit 405, so that either the transistors on the PMOS side or the transistors on the NMOS side are turned off. Therefore, as for the transistors of the output stage, either the current path to the power source VDD or the current path to the power source VSS is cut, so that the power-source control circuit generates no standby leak currents.

Where the level-conversion circuit is in the standby state (where the level of the activation signal ACT is low and that of the inverted-activation signal /ACT is high) and the input signal IN is caused to transition from the level VSSH to the level VDDL, the level-conversion circuit operates, as below. Where the input signal IN is caused to transition to the level VSSH, the PMOS transistor MP11 is turned on, the node N6 is at a high level, the NMOS transistors MN12, MN13, and MN14 are turned on, and the output signal OUT at a low-level signal is transmitted. Where the input signal IN is caused to transition to the level VDDL, the PMOS transistor MP11 is turned off, the NMOS transistor MN11 is turned on, the level of the node N5 becomes low, and the PMOS transistor MP12 is turned on. Although the PMOS transistor MP11 is turned off then, the NMOS transistors MN10 and MN15 are also turned off. Therefore, the node N6 is maintained at the level VDDL, which is a high level, and the NMOS transistor MN12 remains turned on. Subsequently, both the PMOS transistor MP12 and the NMOS transistor MN12 are turned on. The PMOS transistors MP13 and MP14 are turned off and the NMOS transistors MN13 and MN14 are turned on due to the output signal OUT. Further, the output signal is maintained at the low level, so that the previous output state is maintained. Further, since the PMOS transistor MP11, and the NMOS transistors MN10 and MN15 remain turned off, the node N6 is floated. However, since the PMOS transistor MP11 uses the low voltage Vt, the node N6 is maintained at a high level due to the sub-threshold leak current.

Where the input signal IN is caused to transition from the level VDDL to the level VSSH, the level-conversion circuit operates, as below. Where the input signal IN is at the level VDDL, the NMOS transistor MN11 is turned on, the node N5 is maintained at a low level, the PMOS transistors MP12, MP13, and MP14 are turned on, and the output signal OUT is at a high level. Where the input signal IN is caused to transition to the level VSSH, the NMOS transistor MN11 is turned off and the PMOS transistor MP11 is turned on, so that the level of the node N6 becomes high and the NMOS transistor MN12 is turned on. Although the NMOS transistor MN11 is turned off then, the PMOS transistors MP10 and MP15 are also turned off. Therefore, the node N5 is maintained at the VSSH level, which is a low level, and the PMOS transistor MP12 remains turned on.

Consequently, both the PMOS transistor MP12 and the NMOS transistor MN12 are turned on. The PMOS transistors MP13 and MP14 are turned on and the NMOS transistors MN13 and MN14 are turned off due to the output signal OUT. Further, the output signal is maintained at the high level, so that the previous output state is maintained. Further, since the PMOS transistors MP15 and MP10, and the NMOS transistor MN11 remain turned off then, the node N5 is floated. However, since the NMOS transistor MN1 uses the low voltage Vt, the node N5 is maintained at a low level due to the sub-threshold leak current.

As has been described, where the input signal IN is caused to transition to one level to another level during the level-conversion circuit is in the standby state, each of the gates of the PMOS transistors MP13 and MP14, and those of the NMOS transistors MN13 and MN14 is connected to the node N7. Therefore, according to the previous state of the output signal OUT, the PMOS transistors MP13 and MP14, and the NMOS transistors MN13 and MN14 remain turned on/off. Consequently, the output signal OUT remains in the previous output state. Further, even though each of the transfer gates TG3 and TG4 is formed, as a CMOS transfer gate, the configuration thereof may be modified, so long as it can generate the same signal as that of this embodiment.

Thus, this embodiment allows for cutting power supplied from the power sources by using a standby signal and feeding an output signal OUT back to an output-driver stage, so that the data-holding function for holding output data is achieved. Therefore, according to this embodiment, the sub-threshold leak current can be cut during the level-conversion circuit is in the standby state, even though the level-conversion circuit includes transistors using a low voltage Vt. Further, output data can be held when the sub-threshold leak is cut.

Fifth Embodiment

Figure 12:
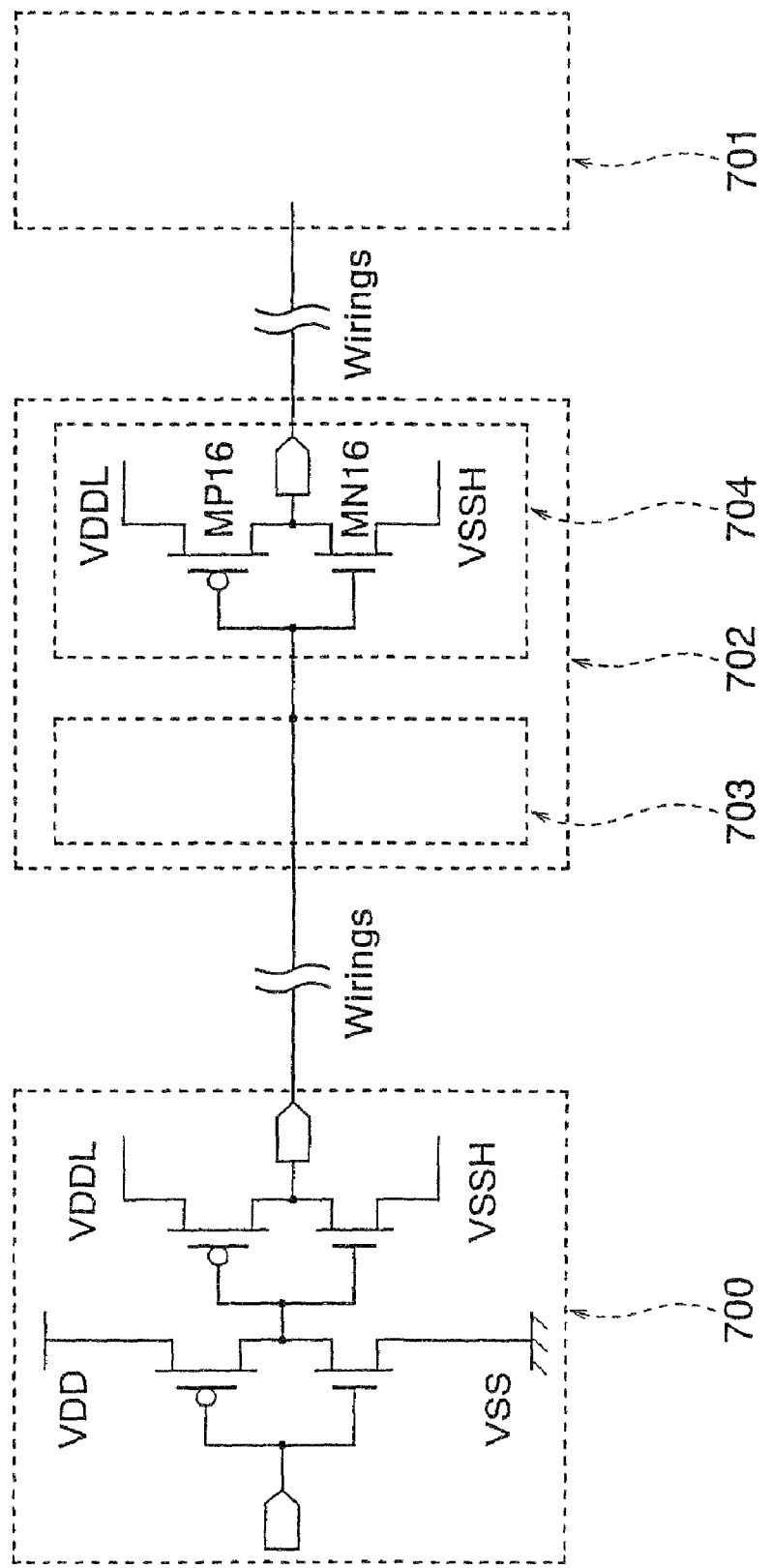
FIG. 12 shows the configuration of a semiconductor circuit according to a fifth embodiment of the present invention.

Next, a fifth embodiment of the present invention will be described in detail with reference to FIG. 12. This drawing shows an example semiconductor circuit, wherein small-amplitude wiring is temporarily buffered between a driver circuit 700 and a level-conversion circuit 701. In recent years, semiconductor circuits have become increasingly large scale and the small-amplitude wiring between circuits thereof has become increasingly long. Therefore, waveform shaping may preferably be performed midway through the semiconductor circuit. According to this embodiment, a small-amplitude signal transmitted from the driver circuit 700 is reshaped and amplified by a buffer circuit 702, and transmitted to the level-conversion circuit 701, as the small-amplitude signal. The buffer circuit 702 includes a level-conversion circuit 703 according to any one of the first to fourth embodiments and a driver unit 704. Upon receiving an output signal transmitted from the level-conversion circuit 703, the driver unit 704 transmits a small-amplitude-level signal.

The driver unit 704 of the buffer circuit 702 includes a PMOS transistor MP16 and an NMOS transistor MN16. The output signal transmitted from the level-conversion circuit 703 is transmitted to each of the gates of the PMOS transistor MP16 and the NMOS transistor MN16. The source of the PMOS transistor MP16 is connected to the power source VDDL, and the source of the NMOS transistor MN16 is connected to the power source VSSH. The drains of the PMOS transistor MP16 and the NMOS transistor MN16 function, as an output end of the buffer circuit 702. The level-conversion circuit 703 converts an input signal with a small amplitude VDDL to VSSH into a signal with an amplitude VDD to VSS. Upon receiving the VDD-to-VSS amplitude signal, the driver unit 704 transmits the signal, as the VDDL-to-VSSH small-amplitude signal again. Thus, since the buffer circuit 702 is provided, the wiring between the circuits forming the semiconductor circuit can be divided and the signal can be reshaped. Accordingly, the semiconductor circuit can transmit signals with high speed and precision.

As has been described, the semiconductor circuit of this embodiment includes the buffer circuit 702 for receiving a small-amplitude signal midway through the long wiring so that the small-amplitude signal is converted into a full-amplitude signal and further converted into the small-amplitude signal again. Accordingly, the small-amplitude signal can operate with high speed on the rising and/or falling edge, even though the wiring length increases.

Thus, the embodiments of the present invention have been described in detail. However, the present invention is not limited to the above-described embodiments, but can be modified in various ways without leaving the scope of the appended claims. For example, though the small-amplitude level of a signal transmitted from the driver circuit has been described as the level VDDL and the level VSSH, the small-amplitude level shown in FIGS. 8 and 9 may be changed to the level VDDL and the level VSS, or the level VDD and the level VSSH.

What is claimed is:

1. A level-conversion circuit, comprising:
a PMOS-driver control unit;
an NMOS-driver control unit;
a PMOS-side power-source control unit;
an NMOS-side power-source control unit;
an output unit; and
an output-feedback unit that outputs an inverted output signal, wherein,
each of the PMOS-driver control unit and the NMOS-driver control unit inverts a small-amplitude input signal and transmits the inverted small-amplitude input signal to the output unit, and
each of the PMOS-side power-source control unit and the NMOS-side power-source control unit establishes electrical continuity between the output unit and at least one power source upon receiving the inverted output signal so that the output unit transmits a large-amplitude output signal.

2. The level-conversion circuit according to claim 1, wherein,
each of the PMOS-side power-source control unit and the NMOS-side power-source control unit transmits a large current to the output unit over a period of time, during which the output signal is delayed.

3. The level-conversion circuit of claim 1,
the output unit including a first transistor for transmitting a first power-source-level large-amplitude output signal and a second transistor for transmitting a second power-source-level large-amplitude output signal;
the PMOS-side power-source control unit including third and fourth transistors; and
the NMOS-side power-source control unit including fifth and sixth transistors,
wherein, when the first transistor is turned on, the third transistor is turned on, the third transistor is turned off after the second power-source-level large-amplitude output signal transitions to the first power-source-level large-amplitude output signal, and the fourth transistor is turned on, and p1 when the second transistor is turned on, the fifth transistor is turned off after the first power-source-level large-amplitude output signal transitions to the second power-source-level large-amplitude output signal, and the sixth transistor is turned on.

4. The level-conversion circuit according to claim 3, wherein,
each of the third and sixth transistors is turned on after the first power-source-level large-amplitude output signal transitions to the second power-source-level large-amplitude output signal, and
each of the fourth and fifth transistors is turned on after the second power-source-level large-amplitude output signal transitions to the first power-source-level large-amplitude output signal.

5. The level-conversion circuit according to claim 3, wherein
the PMOS-driver control unit receives a third power-source-level small-amplitude input signal and a fourth power-source-level small-amplitude input signal; and
the NMOS-driver control unit receives the third power-source-level small-amplitude input signal and the fourth power-source-level small-amplitude input signal,
wherein, the PMOS-driver control unit transmits an output signal of the fourth power-source level, upon receiving the third power-source-level small-amplitude input signal, and transmits an output signal of the first power-source level, upon receiving the fourth power-source-level small-amplitude input signal, and the NMOS-driver control unit transmits an output signal of the third power-source level, upon receiving the fourth power-source-level small-amplitude input signal, and transmits an output signal of the second power-source level, upon receiving the third power-source-level small-amplitude input signal.

6. The level-conversion circuit according to claim 3, wherein, the PMOS-driver control unit comprises i) a seventh transistor for transmitting the fourth power-source-level output signal, ii) an eighth transistor for transmitting the first power-source-level output signal, wherein when the fourth power-source-level output signal is transmitted, the eighth transistor is turned off, and when the first power-source-level output signal is transmitted, the seventh transistor is turned off, and the NMOS-driver control unit comprises i) a ninth transistor for transmitting the third power-source-level output signal, ii) a tenth transistor for transmitting the second power-source-level output signal, wherein when the third power-source-level output signal is transmitted, the tenth transistor is turned off, and when the second power-source-level output signal is transmitted, the ninth transistor is turned off.

7. The level-conversion circuit according to claim 3, wherein, the PMOS-driver control unit is separated from a first power source and the NMOS-driver control unit is separated from a second power source by using an activation signal.

8. The level-conversion circuit, comprising:

an output unit producing an output signal;

a power-source control unit connected between a power source line and the output unit; and an output-feedback unit receiving the output signal and supplying a control signal to the power-source control unit, wherein the power-source control unit supplies the output unit with a power voltage with a first current driving capability when the control signal takes a first level and with a second current driving capability when the control signal takes a second level, and wherein the power-source control unit is a first power-source unit, the power-source line is a first power-source line, and the power voltage is a first power voltage, the level-conversion circuit further comprising:

a second power-source control unit connected between a second power-source line and the output unit;

wherein the second power-source control unit supplies the output unit with a second power voltage with a third current driving capability when the control signal takes the first level and with a fourth current driving capability when the control signal takes the second level.

9. The level-conversion circuit according to claim 8, wherein the first current driving capability is larger than the third current driving capability, and the second driving capability is smaller than the fourth current driving capability.

10. A level-conversion circuit, comprising:

first and second transistors connected in parallel to each other between a first power source and a first node;

third and fourth transistors connected in parallel to each other between a second power source and a second node;

a fifth transistor connected between the first node and an output node;

a sixth transistor connected between the second node and the output node;

a feedback unit connected to the output node and each of the first, second, third, and fourth transistors.

11. The level-conversion circuit according to claim 10, wherein the feedback unit renders the first transistor active with the third transistor and the second transistor active with the fourth transistor.

12. The level-conversion circuit according to claim 11, wherein the first transistor is larger in current driving capability than the third transistor, and the second transistor is smaller in current driving capability than the fourth transistor.

* * * * *